(12) United States Patent
Ma et al.

(10) Patent No.: US 10,699,642 B2
(45) Date of Patent: Jun. 30, 2020

(54) PIXEL CIRCUIT AND DRIVING METHOD THEREOF, ARRAY SUBSTRATE AND DISPLAY DEVICE

(71) Applicants: BOE Technology Group Co., Ltd., Beijing (CN); Hefei BOE Optoelectronics Technology Co., Ltd., Hefei (CN)

(72) Inventors: Juncai Ma, Beijing (CN); Hao Chu, Beijing (CN)

(73) Assignees: BOE Technology Group Co., Ltd., Beijing (CN); Hefei BOE Optoelectronics Technology Co., Ltd., Anhui (CN)

( * ) Notice: Subject to any disclaimer, the term of this patent is extended or adjusted under 35 U.S.C. 154(b) by 25 days.

(21) Appl. No.: 16/114,671

(22) Filed: Aug. 28, 2018

(65) Prior Publication Data
US 2019/0103058 A1  Apr. 4, 2019

(30) Foreign Application Priority Data
Sep. 29, 2017 (CN) .......................... 2017 1 0912157

(51) Int. Cl.
*G09G 3/3258* (2016.01)
*G09G 3/3233* (2016.01)
(Continued)

(52) U.S. Cl.
CPC ......... *G09G 3/3258* (2013.01); *G09G 3/3233* (2013.01); *H01L 51/5056* (2013.01);
(Continued)

(58) Field of Classification Search
None
See application file for complete search history.

(56) References Cited

U.S. PATENT DOCUMENTS

2002/0047839 A1* 4/2002 Kasai .................. G09G 3/3233
345/211
2002/0050962 A1 5/2002 Kasai
(Continued)

FOREIGN PATENT DOCUMENTS

| CN | 1348163 A | 5/2002 |
| CN | 1755780 A | 4/2006 |

(Continued)

OTHER PUBLICATIONS

First office action of Chinese application No. 201710912157.5 dated Apr. 24, 2019.

*Primary Examiner* — Dorothy Harris
(74) *Attorney, Agent, or Firm* — Fay Sharpe LLP

(57) ABSTRACT

Provided are a pixel circuit and driving method thereof, array substrate and display device. The pixel circuit includes a light-emitting element, a driving sub-circuit, a scanning sub-circuit, and a carrier releasing sub-circuit. The driving sub-circuit is connected to a first electrode of light-emitting element, and the driving sub-circuit is configured to store a driving voltage and control the magnitude of a current passing through light-emitting element according to the driving voltage; the scanning sub-circuit is connected to driving sub-circuit. The scanning sub-circuit is configured to update the driving voltage stored by driving sub-circuit during the effective period of first scanning signal; the carrier releasing sub-circuit is connected to a second electrode of light-emitting element, and provides a reverse bias voltage to the second electrode of light-emitting element during the effective period of second scanning signal, thereby delaying the decrease of light-emitting efficiency of light-emitting element along with the service time.

15 Claims, 9 Drawing Sheets

(51) Int. Cl.
*H01L 51/50* (2006.01)
*H01L 51/52* (2006.01)

(52) U.S. Cl.
CPC ...... *H01L 51/5072* (2013.01); *H01L 51/5092* (2013.01); *H01L 51/5203* (2013.01); *G09G 2300/0852* (2013.01); *G09G 2300/0861* (2013.01); *G09G 2310/0262* (2013.01); *G09G 2310/0267* (2013.01)

(56) References Cited

U.S. PATENT DOCUMENTS

| | | | | |
|---|---|---|---|---|
| 2003/0209989 | A1* | 11/2003 | Anzai | G09G 3/3258 315/169.3 |
| 2004/0041525 | A1* | 3/2004 | Park | G09G 3/3233 315/169.3 |
| 2004/0056605 | A1* | 3/2004 | Yoshida | G09G 3/3233 315/169.3 |
| 2004/0095168 | A1* | 5/2004 | Miyazawa | G09G 3/325 327/108 |
| 2004/0108979 | A1* | 6/2004 | Seki | G09G 3/3233 345/76 |
| 2004/0257353 | A1* | 12/2004 | Imamura | G09G 3/3233 345/204 |
| 2006/0012310 | A1* | 1/2006 | Chen | G09G 3/3233 315/169.3 |
| 2006/0066526 | A1 | 3/2006 | Kim et al. | |
| 2007/0018925 | A1* | 1/2007 | Cheng | G09G 3/2014 345/92 |
| 2008/0169754 | A1* | 7/2008 | Yang | G09G 3/3233 313/504 |
| 2016/0224183 | A1* | 8/2016 | Nie | G09G 3/3233 |

FOREIGN PATENT DOCUMENTS

| | | |
|---|---|---|
| CN | 102930820 A | 2/2013 |
| CN | 103440847 A | 12/2013 |
| CN | 106940979 A | 7/2017 |

* cited by examiner

PIXEL CIRCUIT AND DRIVING METHOD THEREOF, ARRAY SUBSTRATE AND DISPLAY DEVICE

This application claims priority to Chinese Patent Application No. 201710912157.5, filed with the State Intellectual Property Office on Sep. 29, 2017 and titled "PIXEL CIRCUIT AND DRIVING METHOD THEREOF, ARRAY SUBSTRATE AND DISPLAY DEVICE", the entire contents of which are incorporated herein by reference.

TECHNICAL FIELD

The present disclosure relates to a pixel circuit and a driving method thereof, an array substrate and a display device.

BACKGROUND

An electroluminescent device is a self-luminous display device and has been widely concerned due to the advantages of a wide viewing angle, high contrast, a high response speed, and etc. With the development in the electroluminescent field, the organic electroluminescent devices such as organic light emitting diode (OLED) display devices can achieve more excellent brightness, power consumption, response rate and color gamut compared with inorganic electroluminescent devices, and have become one of the mainstream in the current display market.

SUMMARY

In an aspect, there is provided in the present disclosure a pixel circuit, comprising a light-emitting element, a driving sub-circuit, a scanning sub-circuit, and a carrier releasing sub-circuit; wherein the driving sub-circuit is connected to a first electrode of the light-emitting element, and the driving sub-circuit is configured to store a driving voltage and control a magnitude of a current passing through the light-emitting element according to the driving voltage; the scanning sub-circuit is connected to the driving sub-circuit, and the scanning sub-circuit is configured to update the driving voltage stored by the driving sub-circuit during an effective period of a first scanning signal; and the carrier releasing sub-circuit is connected to a second electrode of the light-emitting element, and the carrier releasing sub-circuit is configured to provide a reverse bias voltage to the second electrode of the light-emitting element during an effective period of a second scanning signal, the first electrode and the second electrode of the light-emitting element are one of a positive electrode and a negative electrode respectively, and the effective period of the second scanning signal is prior to the effective period of the first scanning signal in each display period.

In a possible implementation, the carrier releasing sub-circuit comprises: a first switching sub-circuit connected to the second electrode of the light-emitting element and configured to provide the reverse bias voltage to the second electrode of the light-emitting element during the effective period of the second scanning signal; and a second switching sub-circuit connected to the second electrode of the light-emitting element and configured to provide a supply voltage of the second electrode of the light-emitting element to the second electrode of the light-emitting element during a period other than the effective period of the second scanning signal.

In a possible implementation, the first switching sub-circuit comprises a first capacitor and a first transistor; wherein a first end of the first capacitor is connected to the second electrode of the light-emitting element, and a second end of the first capacitor is connected to the supply voltage of the second electrode of the light-emitting element; a gate electrode of the first transistor is connected to the second scanning signal, and one of a source electrode and a drain electrode of the first transistor is connected to the reverse bias voltage, and the other one is connected to the second electrode of the light-emitting element; and a voltage of the second scanning signal during the effective period is within a range of a gate electrode voltage enabling the first transistor to be turned on.

In a possible implementation, the second switching sub-circuit comprises a second transistor, a gate electrode of the second transistor is connected to the second scanning signal, and one of a source electrode and a drain electrode of the second transistor is connected to the second electrode of the light-emitting element and the other one is connected to the supply voltage of the second electrode of the light-emitting element; and a voltage of the second scanning signal during the effective period is within a range of the gate electrode voltage enabling the second transistor to be turned off.

In a possible implementation, the driving sub-circuit comprises a second capacitor and a third transistor; wherein a first end of the second capacitor is connected to a supply voltage of the first electrode of the light-emitting element, and a second end of the second capacitor is connected to a gate electrode of the third transistor; and the gate electrode of the third transistor is connected to the scanning sub-circuit, and one of a source electrode and a drain electrode of the third transistor is connected to the supply voltage of the first electrode of the light-emitting element and the other one is connected to the first electrode of the light-emitting diode.

In a possible implementation, the scanning sub-circuit comprises a fourth transistor, a gate electrode of the fourth transistor is connected to the first scanning signal, and one of a source electrode and a drain electrode of the fourth transistor is connected to a data voltage, and the other one is connected to the driving sub-circuit.

In a possible implementation, the light-emitting element comprises a hole injection layer, a hole transport layer, an organic light-emitting layer, an electron transport layer and an electron injection layer that are sequentially stacked between the first electrode and the second electrode.

In a possible implementation, the driving sub-circuit comprises a second capacitor and a third transistor; a first end of the second capacitor is connected to the supply voltage of the first electrode of the light-emitting element, and a second end of the second capacitor is connected to a gate electrode of the third transistor; and the gate electrode of the third transistor is connected to the scanning sub-circuit, and one of a source electrode and a drain electrode of the third transistor is connected to a supply voltage of a first electrode of the light-emitting element, and the other one is connected to the first electrode of the light-emitting diode.

In a possible implementation, the scanning sub-circuit comprises a fourth transistor, a gate electrode of the fourth transistor is connected to the first scanning signal, and one of a source electrode and a drain electrode of the fourth transistor is connected to a data voltage, and the other one is connected to the driving sub-circuit.

In a possible implementation, the light-emitting element comprises a hole injection layer, a hole transport layer, an organic light-emitting layer, an electron transport layer and an electron injection layer that are sequentially stacked between the first electrode and the second electrode.

In another aspect, there is provided in the present disclosure an array substrate, wherein the array substrate comprises a plurality of any pixel circuit described above.

In a possible implementation, the plurality of the pixel circuits are arranged in a plurality of rows and columns, and the array substrate further comprises a plurality of rows of scanning lines respectively connected to each row of pixel circuits; wherein a scanning sub-circuit in any of the pixel circuits is connected to a scanning line of a row in which the pixel circuit is located, to connect the first scanning signal via the scanning line; and a carrier releasing sub-circuit in any of the pixel circuits other than a first row is connected to a scanning line of a row previous to the row in which the pixel circuit is located, to connect the second scanning signal by the scanning line.

In yet another aspect, there is provided in the present disclosure a display device, comprising any one of the pixel circuits described above.

In yet another aspect, there is provided in the present disclosure a display device, comprising any one of the array substrates described above.

In yet another aspect, there is provided in the present disclosure a driving method of a pixel circuit, wherein the pixel circuit comprises a light-emitting element, and the driving method comprises: controlling a magnitude of a current passing through the light-emitting element according to a stored driving voltage; updating the stored driving voltage during an effective period of a first scanning signal; and providing a reverse bias voltage to a second electrode of the light-emitting element during an effective period of a second scanning signal, wherein the first electrode and the second electrode of the light-emitting element are one of a positive electrode and a negative electrode respectively, and the effective period of the second scanning signal is prior to the effective period of the first scanning signal in each display period.

DETAILED DESCRIPTION

In order to make the principles and advantages of the present disclosure clearer, the embodiments of the present disclosure will be further described in detail below in conjunction with the accompanying drawings. It is obvious that the described embodiments are part rather than all of the embodiments of the present disclosure. Unless otherwise defined, the technical terms or scientific terms used in the text should have the ordinary meaning generally understood by the ordinary skilled in the art to which the disclosure belongs. The word "first", "second" and other similar words used in the text do not denote any order, quantity, or importance, but are merely used to distinguish different components. The word "comprising" or other similar words refer to that the element or object before such word covers the element or object and its equivalents listed after such word, without excluding other elements or objects. The word "connected" or "coupled" and other similar words are not limited to physical or mechanical connections, and may comprise electrical connection, and the connections may be direct or indirect.

It can be noted that the light-emitting element, for example an organic light emitting diode (OLED), has a problem that light-emitting efficiency gradually decreases with the service time. In some actual tests, after being driven for 4000~5000 hours, the light-emitting efficiency of the OLED will drop to half of the initial state, resulting in great deterioration of the picture quality. In this regard, a driving voltage may be increased correspondingly according to the decrease of the light-emitting efficiency, which can delay the deterioration of the picture quality of the OLED display device to a certain extent. However, the larger driving voltage also causes greater loss to the OLED, which seriously affects the service life of OLED devices and the OLED display device.

Figure 1:
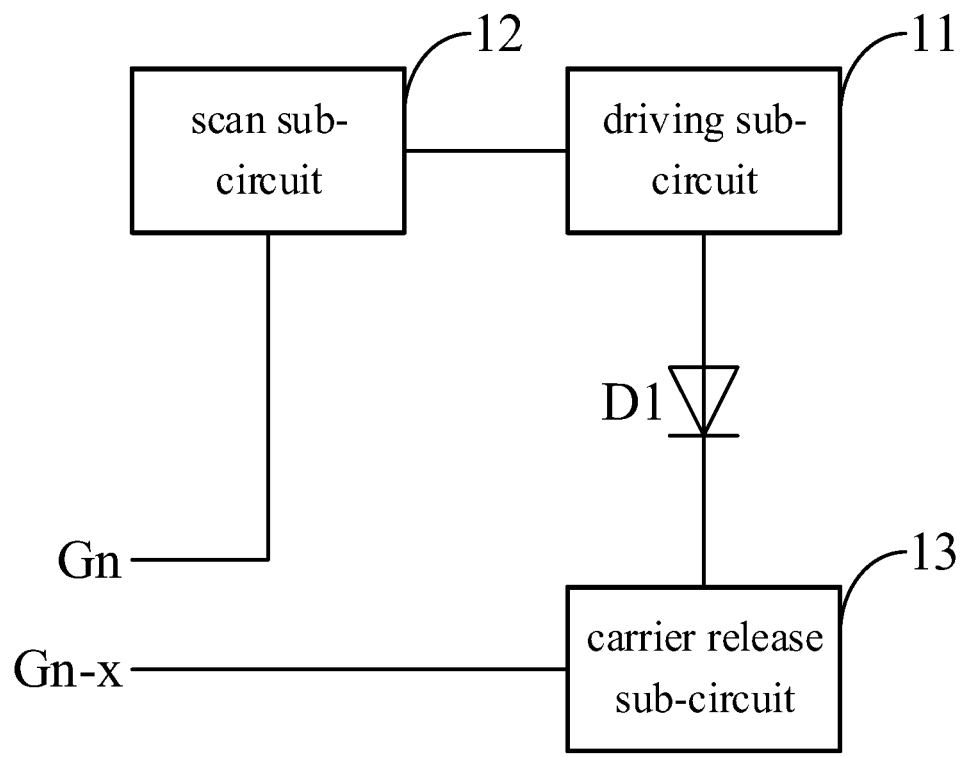
FIG. 1 is a block diagram of a structure of a pixel circuit according to an embodiment of the present disclosure.

FIG. 1 is a block diagram of a structure of a pixel circuit according to an embodiment of the present disclosure. Referring to FIG. 1, the pixel circuit comprises a light-emitting element D1, a driving sub-circuit 11, a scanning sub-circuit 12, and a carrier releasing sub-circuit 13. Exemplarily, the light-emitting element D1 is represented by a circuit symbol of a diode.

As shown in FIG. 1, the driving sub-circuit 11 is connected to a first electrode (exemplarily, a positive electrode of the light-emitting element D1 in an embodiment) of the light-emitting element D1. The driving sub-circuit 11 is configured to store the driving voltage and control the magnitude of the current passing through the light-emitting element D1 in accordance with the driving voltage. It should be understood that the light-emitting element D1 may be an electroluminescent device, for example, an OLED, which can emit lights having different brightness when the currents passing therethrough have different current values. Thus, the light-emitting brightness of the light-emitting element D1 can be controlled through the magnitude of the driving voltage stored in the driving sub-circuit 11.

The scanning sub-circuit 12 is connected to the driving sub-circuit 11 and configured to update the driving voltage stored by the driving sub-circuit 11 during the effective period of a first scanning signal Gn. It should be understood that the first scanning signal Gn may be at an effective level for a period of time in each display period, so that the scanning sub-circuit 12 can update the driving voltage stored by the driving sub-circuit 11 in each display period, and further control the brightness variation of the light-emitting element D1 among multiple display periods. It should be noted that the effective level and the ineffective level herein refer to two different voltage ranges pre-configured for a specific circuit node or signal, respectively. In an example, all effective levels are high levels in a digital circuit in which they are located. In another example, all effective levels are low levels in a digital circuit in which they are located.

The carrier releasing sub-circuit 13 is connected to a second electrode (exemplarily, the negative electrode of the light-emitting element D1 in an embodiment) of the light-emitting element D1. The carrier releasing sub-circuit 13 is configured to provide a reverse bias voltage to the second electrode of the light-emitting element D1 during an effective period of a second scanning signal Gn-x. In each display period, the effective period of the second scanning signal Gn-x (i.e., the period in which the second scanning signal Gn-x is the effective level) is prior to the effective period of the first scanning signal Gn. It should be understood that the reverse bias voltage refers to a voltage that can be connected to the second electrode of the light-emitting element D1, so as to enable the light-emitting element D1 to be in a reverse bias state. The reverse bias voltage may be, for example, a voltage, the potential of which is the same as or higher than the potential of a voltage at the first electrode of the light-emitting element D1 in the embodiments.

It should be understood that the effective period of the second scanning signal Gn-x is prior to the effective period of the first scanning signal Gn in each display period. Therefore, during the period in which the scanning sub-circuit 12 updates the driving voltage stored in the driving sub-circuit 11 and during the period in which the driving sub-circuit 11 controls the light-emitting element D1 to emit light according to the stored driving voltage, the light-emitting element D1 can be maintained in a forward bias state and can be not affected by the carrier releasing sub-circuit 13. Moreover, the carrier releasing sub-circuit 13 provides a reverse bias voltage to the second electrode of the light-emitting element D1 during the period in which the second scanning signal Gn-x is effective, so that the light-emitting element D1 can be in a reverse bias state for a period of time before the driving voltage stored by the driving sub-circuit 11 is updated. In this way, electrons and holes (collectively refer to as "carriers") accumulated inside the light-emitting element D1 can be released, thereby preventing the built-in electric field formed by the electrons and holes accumulated inside the light-emitting element D1 from affecting the light-emitting efficiency of the light-emitting element D1.

It can be seen that based on the configuration of the pixel circuit described above, the light-emitting element can be periodically set to a reverse bias state in the embodiments of the present disclosure, so that the carriers accumulated on the two electrodes of the light-emitting element can be periodically released, thereby preventing the built-in electric field inside the light-emitting element from gradually increasing and hindering the light emission. Therefore, in the embodiments of the present disclosure, the decrease of the light-emitting efficiency of the light-emitting element along with the service time can be delayed, which is favorable to prolong the light-emitting life of the light-emitting element, suppress the deterioration of the picture quality of the OLED display device along with the service time, and prolong the service life of the OLED display device.

Figure 2A:
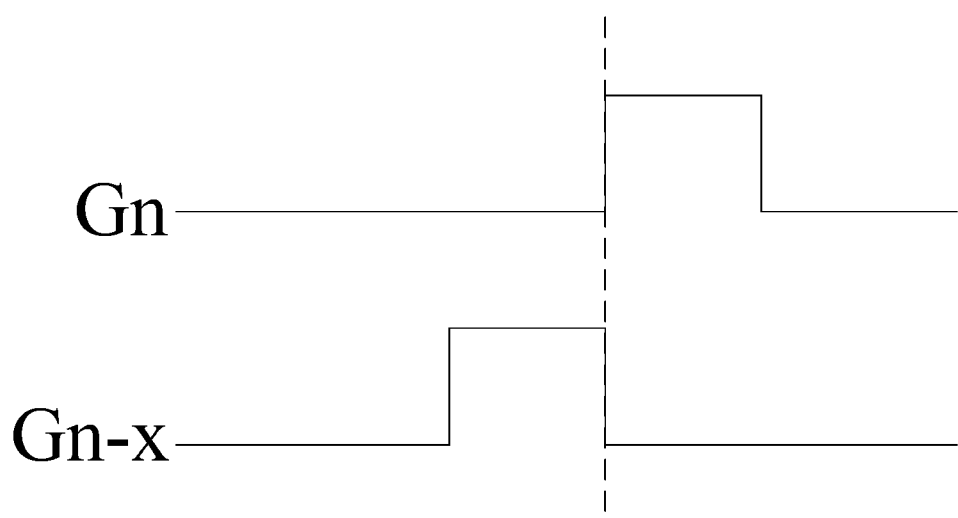
FIG. 2A, FIG. 2B, FIG. 2C and FIG. 2D are schematic diagrams illustrating timing relationships between a first scanning signal and a second scanning signal according to an embodiment of the present disclosure.
Figure 2B:
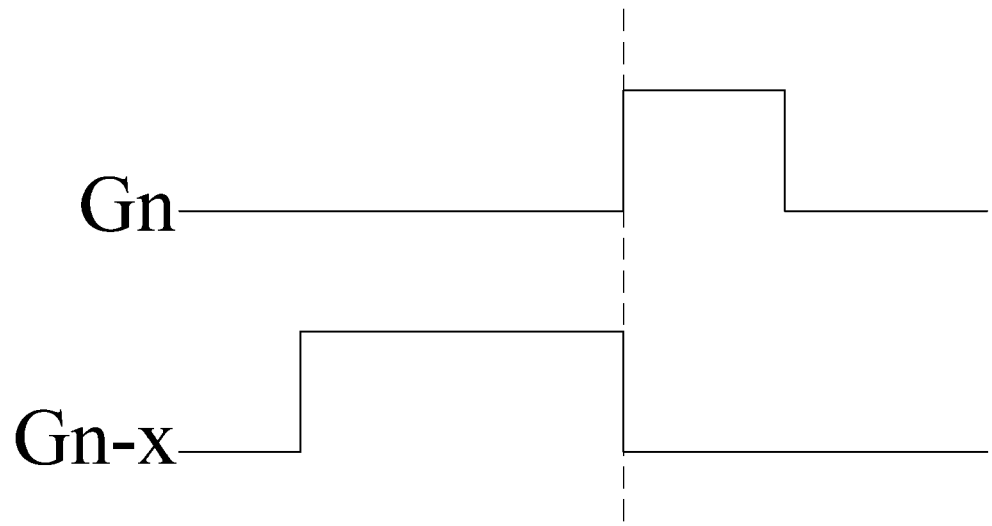
Figure 2C:
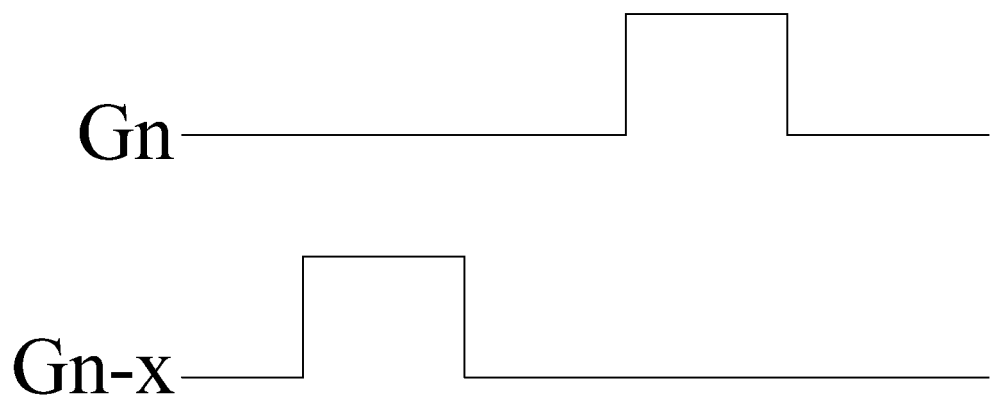
Figure 2D:
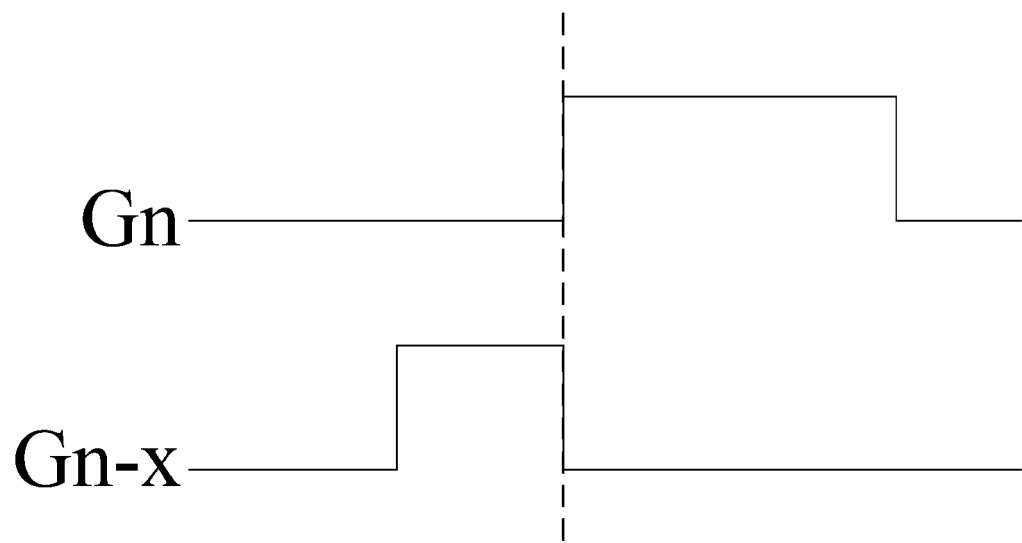

Regarding a timing relationship between the first scanning signal Gn and the second scanning signal Gn-x, FIGS. 2A, 2B, 2C, and 2D are an exemplary implementation manner respectively. Exemplarily, the effective levels of the first scanning signal Gn and the second scanning signal Gn-x are both high levels, and the ineffective levels of the first scanning signal Gn and the second scanning signal Gn-x are both low levels. Each display period of the pixel circuit is a single display frame. Referring to FIG. 2A, in an example, a duration of the first scanning signal Gn being at the effective level is the same as a duration of the second scanning signal Gn-x being at the effective level in each display frame, and a rising edge of the first scanning signal Gn is aligned with a falling edge of the second scanning signal Gn-x. Referring to FIG. 2B, in an example, a duration of the first scanning signal Gn being at the effective level is less than a duration of the second scanning signal Gn-x being at the effective level in each display frame, and a rising edge of the first scanning signal Gn is aligned with a falling edge of the second scanning signal Gn-x. Referring to FIG. 2C, in an example, a duration of the first scanning signal Gn being at the effective level is the same as a duration of the second scanning signal Gn-x being at the effective level in each display frame, and there is a time interval between a rising edge of the first scanning signal Gn and a falling edge of the second scanning signal Gn-x. Referring to FIG. 2D, in an example, a duration of the first scanning signal Gn being at the effective level is greater than a duration of the second scanning signal Gn-x being at the effective level in each display frame, and a rising edge of the first scanning signal Gn is aligned with the falling edge of the second scanning signal Gn-x. Of course, the timing relationship between the first scanning signal Gn and the second scanning signal Gn-x may not be limited to the above examples.

Figure 3:
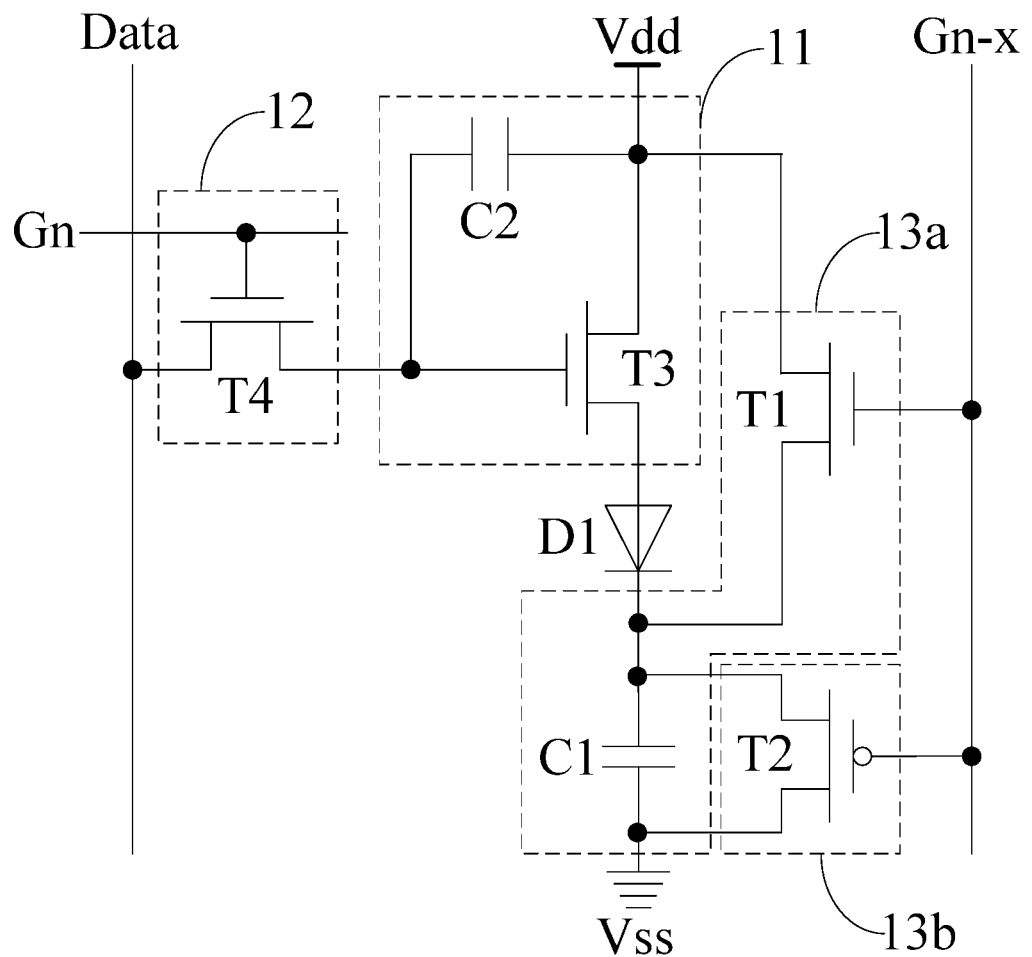
FIG. 3 is a schematic diagram of a circuit structure of a pixel circuit according to an embodiment of the present disclosure.

FIG. 3 is a schematic diagram of a pixel structure of a pixel circuit according to an embodiment of the present disclosure. Referring to FIG. 3, the pixel circuit of the embodiments comprises a light-emitting element D1, a driving sub-circuit 11, a scanning sub-circuit 12, and a carrier releasing sub-circuit 13. The light-emitting element D1 is an OLED, and the carrier releasing sub-circuit 13 comprises a first switching sub-circuit 13a and a second switching sub-circuit 13b.

Herein, the driving sub-circuit 11 comprises a second capacitor C2 and a third transistor T3. A first end (the right end of the second capacitor C2 in FIG. 3) of the second capacitor C2 is connected to a supply voltage of the positive electrode, i.e., a positive electrode supply voltage Vdd, of the light-emitting element D1. A second end (the left end of the second capacitor C2 in FIG. 3) of the second capacitor C2 is connected to a gate electrode T3 of the third transistor. The gate electrode of the third transistor T3 is also connected to the scanning sub-circuit 12. One of a source electrode and a drain electrode of the third transistor T3 is connected to the supply voltage of the first electrode, i.e., the positive electrode supply voltage Vdd, of the light-emitting element D1, and the other one is connected to the positive electrode (i.e., the first electrode) of the light-emitting diode D1. It should be noted that according to different specific types of the transistor, the connection relationships of the source electrode and the drain electrode may be respectively set to match the direction of a current flowing through the transistor. When the transistor has a structure in which the source electrode and the drain electrode are symmetrical, the source electrode and the drain electrode can be regarded as two electrodes that are not particularly distinguished. Based on this, when the second capacitor C2 stores a charging voltage previously obtained by charging and discharging, the second capacitor C2 can play a role of clamping between the gate electrode and the drain electrode of the third transistor T3. That is, the current passing through the light-emitting element D1 is fixed to a current value related to the voltage across two ends of the second capacitor C2. In this way, the above function of storing the driving voltage by the driving sub-circuit 11 and controlling the magnitude of the current passing through the light-emitting element D1 in accordance with the driving voltage can be realized. It should be understood that the circuit structure of the driving sub-circuit 11 can be set by referring to the OLED pixel sub-circuit or the active-matrix (AM) OLED pixel circuit in the related art, and may not be limited to the above forms. For example, in some possible implementations, the first end (the right end of the second capacitor C2 in FIG. 3) of the second capacitor C2 may be changed to connect to the positive electrode (the first electrode) of the light-emitting element D1, or may be changed to connect to the source electrode of a switching transistor (in an example, the gate electrode of the switching transistor is connected to a light-emitting switch control signal, and the drain electrode is connected to the positive electrode supply voltage Vdd, thereby playing a role of controlling the on-off state between the positive electrode supply voltage Vdd and the driving sub-circuit 11). Of course, the implementation manners of the driving sub-circuit 11 may not be limited thereto.

As shown in FIG. 3, the scanning sub-circuit 12 comprises a fourth transistor T4. A gate electrode of the fourth transistor T4 is connected to the first scanning signal Gn. One of a source electrode and a drain electrode of the fourth transistor T4 is connected to a data line Data configured to provide a data voltage, and the other one is connected to the driving sub-circuit 11. In an example, the voltage of the first scanning signal Gn during the effective period may be set within a range of the gate electrode voltage that can enable the fourth transistor T4 to be turned on (in an example, the fourth transistor T4 is an N-type thin film transistor, and the voltage of the first scanning signal Gn during the effective period is a high level voltage). Based on this, when the first scanning signal Gn is at the effective level, the fourth transistor T4 is turned on, and the data voltage on the data line Data, as a charging voltage, can charge the second capacitor C2, so that the voltage at the second end of the second capacitor C2 reaches a voltage value same as the data voltage through the charging and discharging of the second capacitor C2. In this way, the function of updating the driving voltage stored by the driving sub-circuit 11 by the scanning sub-circuit 12 during the effective period of the first scanning signal Gn can be realized. It should be understood that the circuit structure of the driving sub-circuit 11 can be set by referring to the OLED pixel sub-circuit or the AM-OLED pixel circuit in the related art, and may not be limited to the above forms. For example, in some possible implementations, the scanning sub-circuit 12 may further comprise a circuit structure for compensating a threshold voltage of the third transistor T3, and/or a circuit structure for detecting the threshold voltage of the third transistor T3. Further, the scanning sub-circuit 12 may also be connected to a scanning signal other than the first scanning signal. Of course, the implementation manner of the scanning sub-circuit 12 may not be limited thereto. It should be noted that according to different circuit structures of the pixel circuit, the driving voltage stored by the driving sub-circuit 11 may be not only related to the above data voltage, but also, for example, related to the threshold voltage of the third transistor T3 and/or an external voltage having a preset voltage value.

The first switching sub-circuit 13a is connected to the second electrode (the negative electrode of the light-emitting element D1 in the embodiments) of the light-emitting element D1 and configured to provide a reverse bias voltage to the second electrode of the light-emitting element D1 during the effective period of the second scanning signal Gn-x. In FIG. 3, a structure comprising the first transistor T1 and the first capacitor C1 is taken as an example of the circuit structure of the first switching sub-circuit 13a. Herein, the first end (the upper end of the first capacitor C1 in FIG. 3) of the first capacitor C1 is connected to the second electrode of the light-emitting element D1, and the second end (the lower end of the first capacitor C1 in FIG. 3) of the first capacitor C1 is connected to the supply voltage of the second electrode, i.e., a negative electrode supply voltage Vss, of the light-emitting element D1. The gate electrode of the first transistor T1 is connected to the second scanning signal Gn-x. One of the source electrode and the drain electrode of the first transistor T1 is connected to the positive electrode supply voltage Vdd, and the other one is connected to the second electrode of the light-emitting element D1. It should be understood that the positive electrode supply voltage Vdd is used as the reverse bias voltage in the embodiments. Moreover, the voltage of the second scanning signal Gn-x during the effective period is within a range of a gate electrode voltage that can enable the first transistor T1 to be turned on (in an example, the first transistor T1 is an N-type thin film transistor, and the voltage of the second scanning signal Gn-x during the effective period is a high level voltage). Based on the above structures, the first transistor T1 is turned on when the second scanning signal Gn-x is at the effective level. Under the action of the positive electrode supply voltage Vdd, a current flowing to the first end of the first capacitor C1 is formed in the first transistor T1. Therefore, the first capacitor C1 can be charged to a state in which the first end is at the positive electrode supply voltage Vdd. Meanwhile, the first end of the light-emitting element D1 reaches a potential equal to or smaller than a potential of the positive electrode supply voltage Vdd under the common action of the third transistor T3 and the second capacitor C2. Therefore, the light-emitting element D1 is brought into a reverse bias state. In this way, the above function of providing the reverse bias voltage to the second electrode of the light-emitting element D1 by the first switching sub-circuit 13a during the effective period of the second scanning signal Gn-x can be realized.

The second switching sub-circuit 13b is connected to the second electrode of the light-emitting element D1 and configured to provide the supply voltage of the second electrode, i.e., the negative electrode supply voltage Vss, of the light-emitting element D1 to the second electrode of the light-emitting element D1 during a period other than the effective period of the second scanning signal Gn-x. In FIG. 3, a structure comprising the second transistor T2 is taken as an example of the circuit structure of the second switching sub-circuit 13b. The gate electrode of the second transistor T2 is connected to the second scanning signal Gn-x. One of the source electrode and the drain electrode of the second transistor T2 is connected to the second electrode of the light-emitting element D1, and the other one is connected to the negative electrode power source voltage Vss. Moreover, the voltage of the second scanning signal Gn-x during the effective period is within a range of a gate electrode voltage that can enable the second transistor T2 to be turned off (in an example, the second transistor T2 is a P-type thin film transistor, and the voltage of the second scanning signal Gn-x during the effective period is a low level voltage). Therefore, the second transistor T2 is turned off when the second scanning signal Gn-x is at the effective level. The first switching sub-circuit 13a can provide a reverse bias voltage to the second electrode of the light-emitting element D1 without hindrance. When the second scanning signal Gn-x is at an ineffective level, the second transistor T2 is turned on, and both ends of the first capacitor C1 are set to the negative electrode supply voltage Vss, and the light-emitting element D1 is restored to be in the forward bias state. Therefore, the above function of providing the supply voltage of the second electrode of the light-emitting element D1 to the second electrode of the light-emitting element D1 during a period other than the effective period of the second scanning signal Gn-x can be realized.

Based on the above configurations of the first switching sub-circuit 13a and the second switching sub-circuit 13b, the carrier releasing sub-circuit 13 can provide an reverse bias voltage to the second electrode of the light-emitting element D when the second scanning signal Gn-x is effective, and provide a supply voltage of the second electrode of the light-emitting element D1 to the second electrode of the light-emitting element D1 when the second scanning signal Gn-x is ineffective. Therefore, the light-emitting element D1 can be periodically set in a reverse bias state without affecting the normal operation of the driving sub-circuit 11 and the scanning sub-circuit 12, which is favorable to delay the decrease in the light-emitting efficiency of the light-emitting element D along with the service time.

Figure 4:
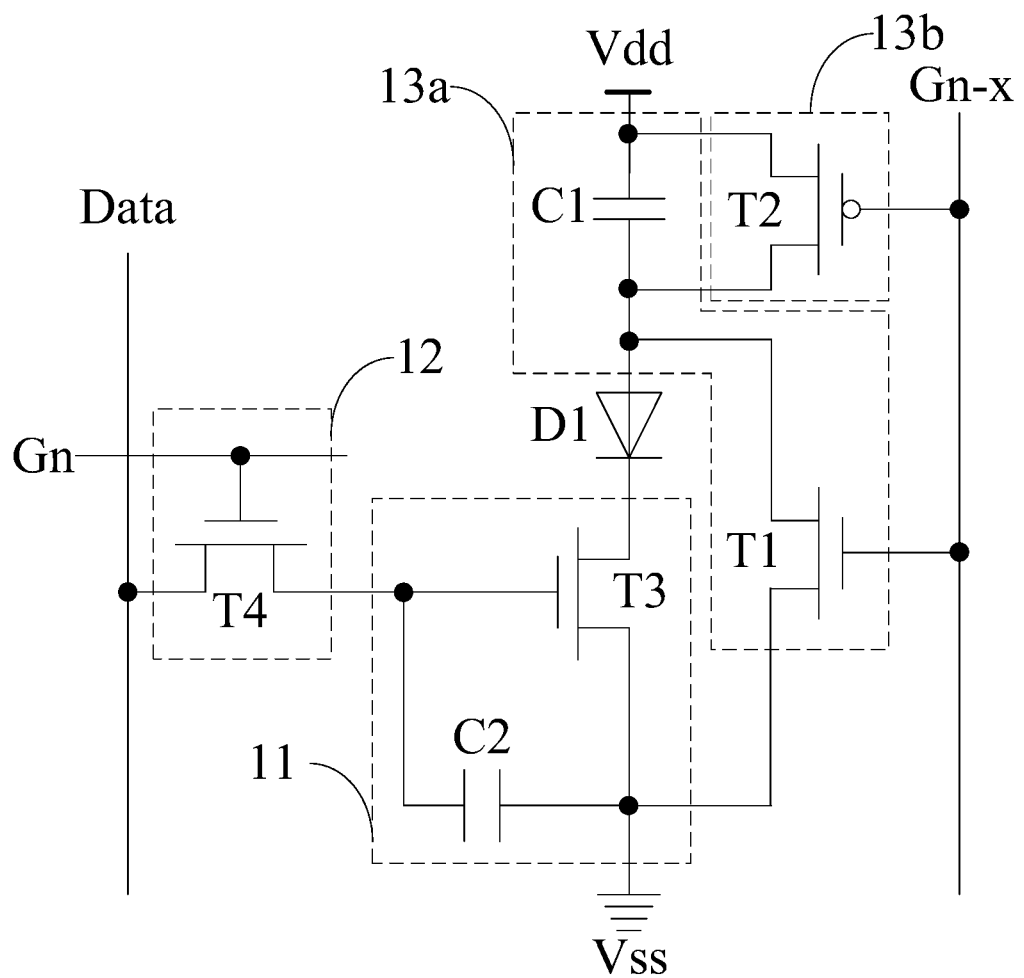
FIG. 4 is a schematic diagram of a circuit structure of a pixel circuit according to another embodiment of the present disclosure.

FIG. 4 is a schematic diagram of a circuit structure of a pixel circuit according to another embodiment of the present disclosure. Referring to FIG. 4, the pixel circuit comprises a light-emitting element D1, a driving sub-circuit 11, a scanning sub-circuit 12, and a carrier releasing sub-circuit 13. Herein, the light-emitting element D is an OLED, and the carrier releasing sub-circuit 13 comprises a first switching sub-circuit 13a and a second switching sub-circuit 13b.

The driving sub-circuit 11 comprises a second capacitor C2 and a third transistor T3. A first end (the right end of the second capacitor C2 in FIG. 4) of the second capacitor C2 is connected to a negative electrode supply voltage Vss (i.e., the supply voltage of the first electrode of the light-emitting element D1). A second end (the left end of the second capacitor C2 in FIG. 4) of the second capacitor C2 is connected to a gate electrode of the third transistor T3. The gate electrode of the third transistor T3 is also connected to the scanning sub-circuit 12. One of a source electrode and a drain electrode of the third transistor T3 is connected to the negative electrode supply voltage Vss, and the other one is connected to the negative electrode (the first electrode) of the light-emitting diode D1.

The scanning sub-circuit 12 comprises a fourth transistor T4. A gate electrode of the fourth transistor T4 is connected to the first scanning signal Gn. One of a source electrode and a drain electrode of the fourth transistor T4 is connected to a data line Data configured for providing a data voltage, and the other one is connected to the driving sub-circuit 11.

The first switching sub-circuit 13a is connected to a second electrode of the light-emitting element D1 (the positive electrode of the light-emitting element D1 in the embodiments) and configured to provide a reverse bias voltage to the positive electrode (the second electrode) of the light-emitting element D1 during the effective period of the second scanning signal Gn-x. In FIG. 4, a structure comprising the first transistor T1 and the first capacitor C1 is taken as an example of the circuit structure of the first switching sub-circuit 13a. Herein, the first end (the lower end of the first capacitor C1 in FIG. 4) of the first capacitor C1 is connected to the positive electrode (the second electrode) of the light-emitting element D1. The second end of the first capacitor C1 is connected to the positive electrode supply voltage Vdd (i.e., the supply voltage of the second electrode of the light-emitting element D1). The gate electrode of the first transistor T1 is connected to the second scanning signal Gn-x. One of the source electrode and the drain electrode of the first transistor T1 is connected to the negative electrode supply voltage Vss, and the other one is connected to the positive electrode (the second electrode) of the light-emitting element D1.

The second switching sub-circuit 13b is connected to the positive electrode (the second electrode) of the light-emitting element D1 and configured to provide the positive electrode supply voltage Vdd to the second electrode of the light-emitting element D1 during a period other than the effective period of the second scanning signal Gn-x. In FIG. 4, a structure comprising the second transistor T2 is taken as an example of the circuit structure of the second switching sub-circuit 13b. The gate electrode of the second transistor T2 is connected to the second scanning signal Gn-x. One of the source electrode and the drain electrode of the second transistor T2 is connected to the positive electrode (the second electrode) of the light-emitting element D1, and the other one is connected to the supply voltage of the second electrode, i.e., the positive electrode supply voltage Vdd, of the light-emitting element D1.

It should be understood that the pixel circuit shown in FIG. 4 has the same working principle as the pixel circuit shown in FIG. 3, and thus the related description may refer to the above context, which is not described here again.

Figure 5:
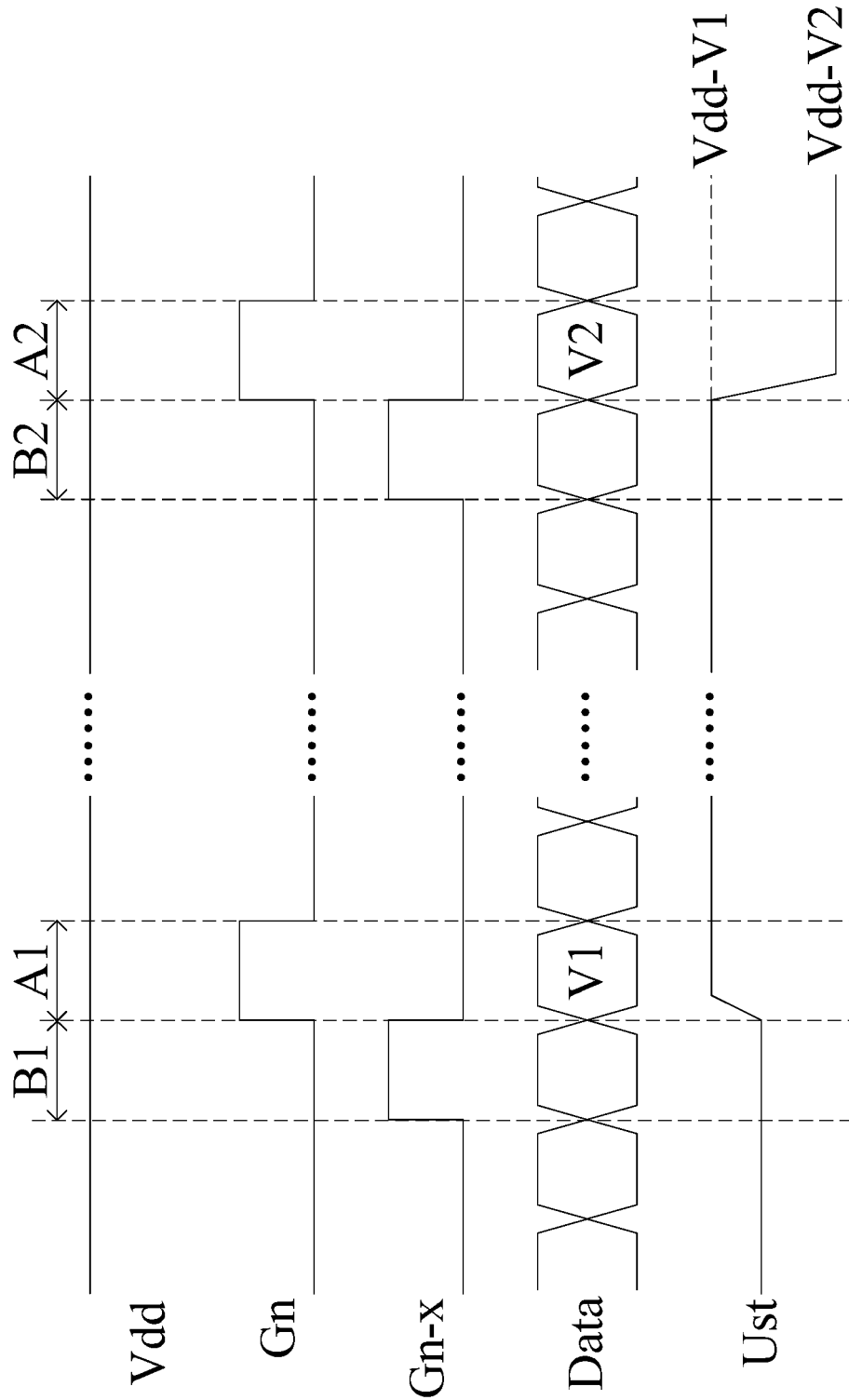
FIG. 5 is a circuit timing diagram of a pixel circuit according to an embodiment of the present disclosure.
Figure 6:
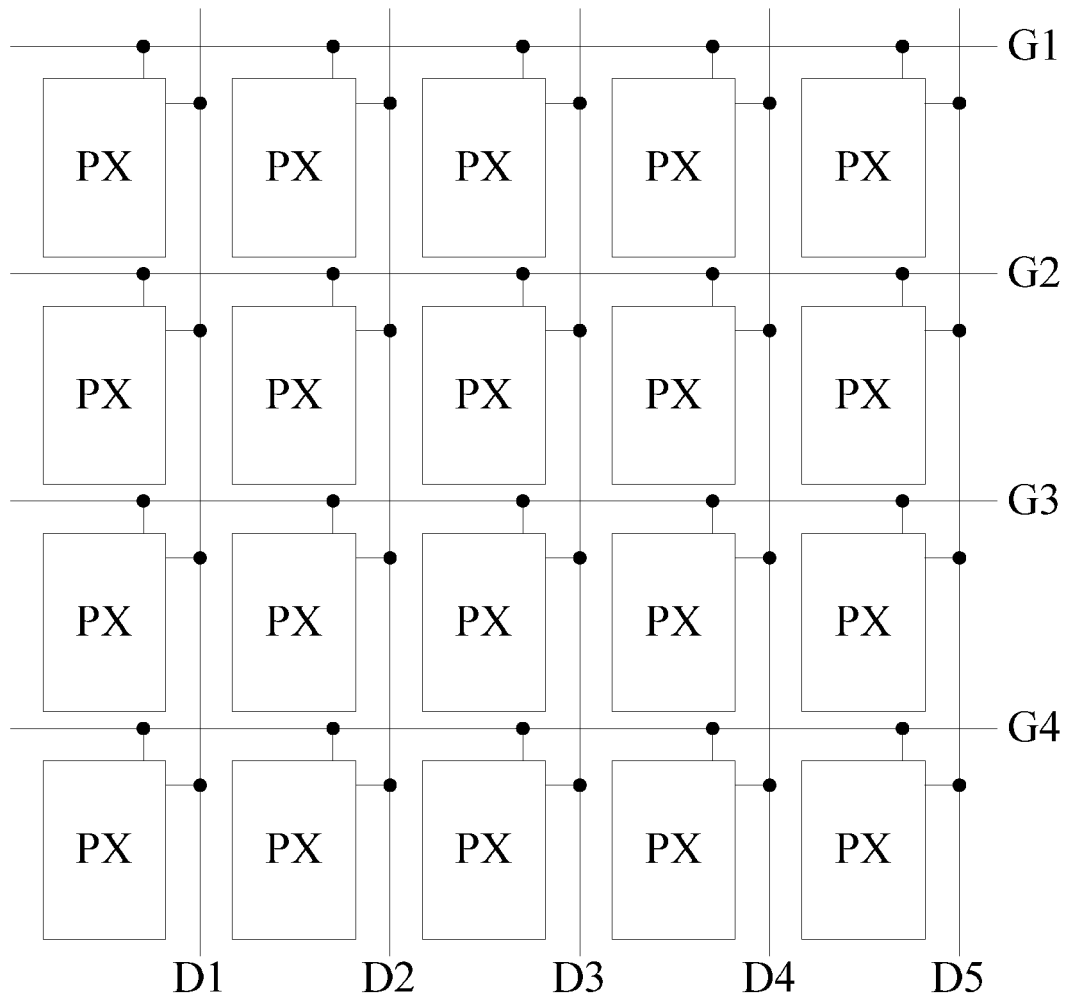
FIG. 6 is a schematic diagram of a structure of a circuit in a display area of an array substrate according to an embodiment of the present disclosure.

In an example, a circuit timing of the pixel circuit shown in FIG. 3 is as shown in FIG. 5. In an example, the pixel circuit is disposed in a display area (the active area, AA) of an array substrate according to a connection manner as shown in FIG. 6). Referring to FIG. 6, a plurality of pixel circuits PX as shown in FIG. 3 are arranged in a plurality of rows and columns (an example of four rows and five columns is shown in FIG. 6). Each row of scanning lines (for example, scanning lines G1, G2, G3, G4) on the array substrate are respectively connected to each row of pixel circuits. Each column of data lines (such as data lines D1, D2, D3, D4, D5) on the array substrate are respectively connected to each column of pixel circuits. For the sake of clearness, it is not shown in detail in FIG. 6 that the scanning sub-circuit 12 in any of the pixel circuits PX is connected to the scanning line of a row in which the pixel circuit PX is located, so as to connect the first scanning signal via the scanning line. The carrier releasing sub-circuit 13 in a row other than the first row in any of the pixel circuits PX is connected to the scanning line of a row previous to the row in which the pixel circuit PX is located, so as to connect the second scanning signal via the scanning line. For example, in FIG. 6, the uppermost row is taken as the first row, and the leftmost column is taken as the first column. For the pixel circuit PX in the third row and the fourth column, the scanning sub-circuit 12 is connected to the scanning line G3 of the row in which the pixel circuit PX is located, while the carrier releasing sub-circuit 13 is connected to the scanning line G2 of a row previous to the row in which the pixel circuit PX is located. Therefore, the scanning signal on the scanning line G3 is the first scanning signal Gn of the pixel circuit PX, and the scanning signal on the scanning line G2 is the second scanning signal Gn-x of the pixel circuit PX. In addition, the scanning sub-circuit 12 in any pixel circuit PX may be further connected to the data line of the column in which the pixel circuit PX is located, so as to update the driving voltage stored by the driving sub-circuit 11 through the data voltage on the data line. For example, the scanning sub-circuit 12 in the pixel circuit PX in the third row and the fourth column is connected to the data line D4 of the column in which the pixel circuit PX is located, so that the data voltage can be obtained from the data line D4, thereby updating the driving voltage stored by the driving sub-circuit 11 when the first scanning signal Gn is at the effective level by using the data voltage on the data line D4.

Next, the circuit timing shown in FIG. 5 will be illustrated by taking the pixel circuit PX in the third row and the fourth column as an example. FIG. 5 shows the circuit timing of the pixel circuit PX between two adjacent display frames. As shown in FIG. 5, the positive electrode supply voltage Vdd is always kept constant. The first scanning signal Gn of the pixel circuit PX is at the effective level for a short period of time in each display frame, and the second scanning signal Gn-x of the pixel circuit PX is at the effective level for a short period of time. The durations in which the first scanning signal Gn and the second scanning signal Gn-x are at the effective level in each display frame are the same. In each display frame, the rising edge of the first scanning signal Gn and the falling edge of the second scanning signal Gn-x are aligned. For two adjacent display frames comprising a former display frame and a latter display frame: in an effective period A1 of the first scanning signal Gn in the former display frame, the magnitude of the voltage on the data line Data (i.e., the data line D4 in FIG. 6) connected to the pixel circuit PX is V1; in an effective period A2 of the first scanning signal Gn in the latter display frame, the magnitude of the voltage of the data line Data (i.e., the data line D4 in FIG. 6) connected to the pixel circuit PX is V2. Therefore, in the effective period A1 of the first scanning signal Gn, the driving voltage Ust stored by the second capacitor C2 shown in FIG. 3 is updated by the scanning sub-circuit 11 to a voltage having a magnitude equal to Vdd-V1. While in the effective period A2 of the first scanning signal Gn, the driving voltage Ust stored by the second capacitor C2 shown in FIG. 3 is updated by the scanning sub-circuit 11 to a voltage having a magnitude equal to Vdd-V2.

It can be inferred that in the effective periods B1 and B2 of the second scanning signal Gn-x (i.e., the scanning signal on the scanning line G2 in FIG. 6), the pixel circuit PX of the second row also updates the stored driving voltage according to the same process. However, during such periods, the carrier releasing sub-circuit 13 of the pixel circuit PX in the third row will provide a reverse bias voltage to the light-emitting element D1 in the pixel circuit PX in the third row. Such a process will neither affect the process of updating the stored driving voltage by the pixel circuit PX of the second row nor affect the process of updating the stored driving voltage by the pixel circuit PX of the third row thereafter.

It can also be inferred that by taking the pixel circuit PX in the third row and the fourth column as an example, the light-emitting element D in the pixel circuit PX is maintained in a forward bias state between the period A1 and the period B2, which thus can correspondingly emit light according to the stored driving voltage Ust=Vdd−V1. Other light-emitting periods are also after the effective period of the first scanning signal Gn in the former display frame is ended and before the effective period of the second scanning signal Gn-x in the latter display frame begins. Since the ratio of the period B1 and the period B2 to the display frame is very small, the existence of the period B1 and the period B2 does not significantly affect the normal display light emission under the circuit timing as shown in FIG. 5.

Figure 7:
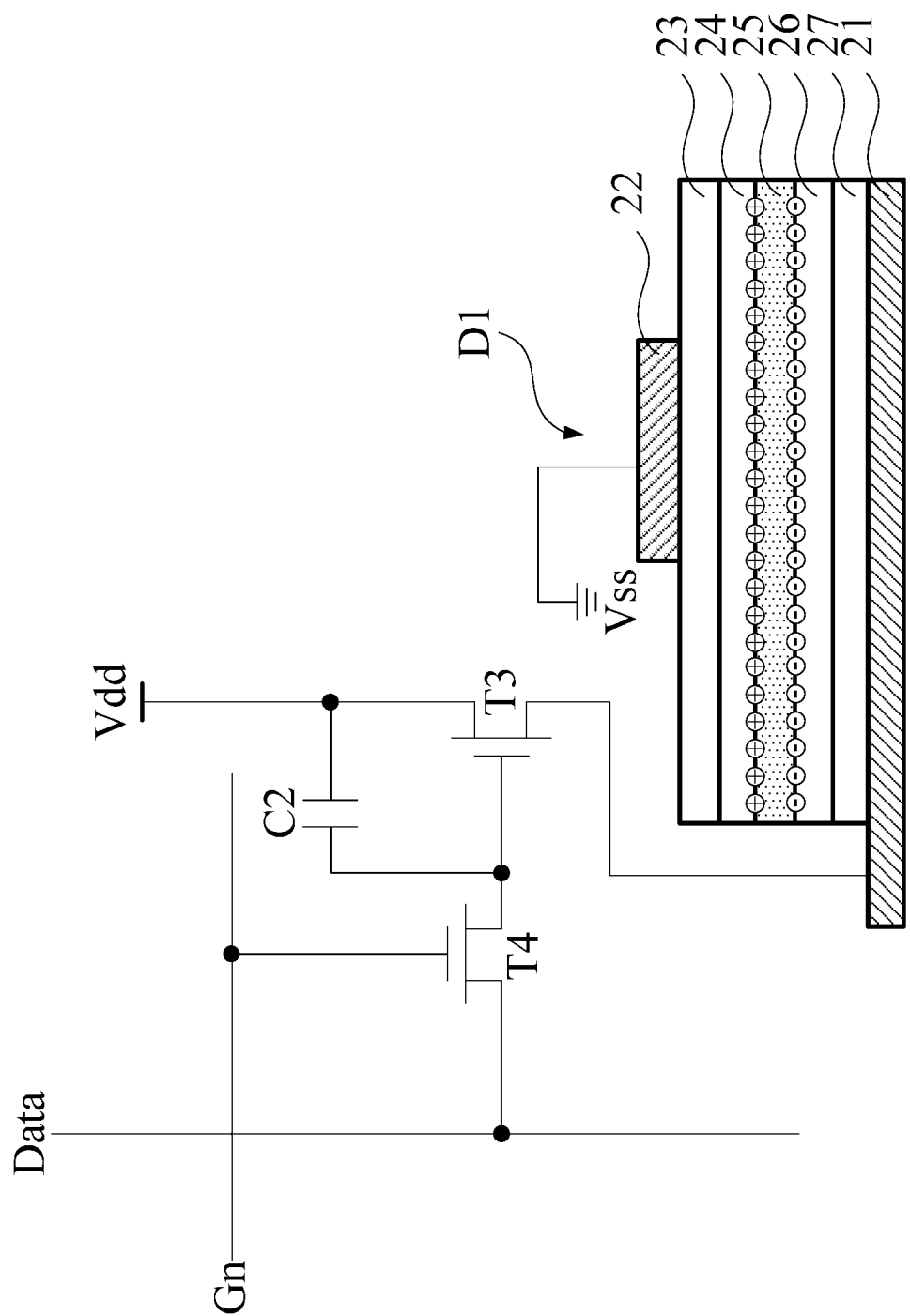
FIG. 7 is a schematic diagram of a structure of a pixel circuit according to an comparative example of the present disclosure.

FIG. 7 is a schematic diagram of a structure of a pixel circuit provided in a comparative example of the present disclosure. Referring to FIG. 7, FIG. 7 shows the internal device structure of the light-emitting element D1 which is an OLED. Compared with the structure shown in FIG. 3, the setting of the carrier releasing sub-circuit 13 is removed from the pixel circuit as shown in FIG. 7, and the second electrode (the negative electrode of the light-emitting element D1) of the light-emitting element D1 is directly connected to the supply voltage of the second electrode, i.e., the negative electrode supply voltage Vss, of the light-emitting element D1. As shown in FIG. 7, the light-emitting element D1 comprises a hole injection layer 27, a hole transport layer 26, an organic light-emitting layer 25, an electron transport layer 24 and an electron injection layer 23 that are sequentially stacked between the positive electrode 21 and the negative electrode 22, in addition to the positive electrode 21 and the negative electrode 22.

In the comparative example, the driving sub-circuit 11 consisting of the third transistor T3 and the second capacitor C2 can still store the driving voltage and control the magnitude of the current passing through the light-emitting element D1 according to the stored driving voltage. The scanning sub-circuit 12 can still update the driving voltage stored by the driving sub-circuit 11 between display frames. However, as shown in FIG. 7, as the electrons from the negative electrode 22 and the holes from the positive electrode 21 are continuously recombined in the organic light-emitting layer 25 to emit light, the holes not involved in the recombination are gradually accumulated between the organic light-emitting layer 25 and the electron transport layer 24, and the electrons not involved in the recombination are gradually accumulated between the organic light-emitting layer 25 and the electron transport layer 24. Therefore, a built-in electric field with a direction opposite to a direction of an external electric field is formed inside the light-emitting element D1. Under the action of the built-in electric field, the process of migrating the holes from the positive electrode 21 to the organic light-emitting layer 25 and the process of migrating the electrons from the negative electrode 22 to the organic light-emitting layer 25 are both hindered, which is externally expressed as a decrease in the light-emitting efficiency of the light-emitting element D1.

In the embodiments of the present disclosure, since the light-emitting element D1 can periodically be set to the reverse bias state by the carrier releasing sub-circuit 13, under the reverse bias state, the holes accumulated between the organic light-emitting layer 25 and the electron transport layer 24 may be returned to the positive electrode 21 with an action of an external electric field, and the electrons accumulated between the organic light-emitting layer 25 and the electron transport layer 24 may be returned to the negative electrode 22 with the action of the external electric field. Therefore, the pixel circuit according to the embodiments of the present disclosure can help to eliminate the carriers not involved in the recombination and gradually accumulated in the light-emitting element D1, and further can help to eliminate the built-in electric field formed inside the light-emitting element D1. Therefore, it is favorable to prevent the built-in electric field inside the light-emitting element from gradually increasing and hindering the light emission, and delay the decrease of the light-emitting efficiency of the light-emitting element D1 with the service time. Therefore, in the embodiments of the present disclosure, the decrease of the light-emitting efficiency of the light-emitting element along with the service time can be delayed, which is favorable to prolong the light-emitting life of the light-emitting element, suppress the deterioration of the picture quality of the OLED display device along with the service time, and prolong the service life of the OLED display device.

It should be understood that the circuit timing as shown in FIG. 5 can also be configured to represent the circuit timing of the pixel circuit as shown in FIG. 4. The principles and processes involved are the same or similar, which are not repeated herein. It should also be understood that, in addition to the obtainment of second scanning signal by using the scanning line in the previous row, the corresponding second scanning signal can also be obtained by using, for example, the scanning line in a row previous to the previous row or an external signal line. The influences of different implementing manners on the display light emission of the light-emitting component are different to some extent and can be set according to actual application requirements. It should also be understood that the internal device structure of the OLED of the light-emitting element D1 as shown in FIG. 7 may be applied to any of the above pixel circuits, and the implementation manner of the OLED may be not limited thereto.

It should be noted that in the above descriptions, the first transistor M1, the third transistor M3 and the fourth transistor M4 in FIG. 3 and FIG. 4 are all N-type thin film transistors, and the second transistor M2 is P-type thin film transistor. However, based on the above implementation manners, it may also adopt the low level as the effective level and the high level as the ineffective level, and/or change part or all of the N-type transistors into the P-type transistors. For example, the following change can be made on the basis of the embodiments: all of the N-type transistors in FIGS. 3 and 4 are set to be the P-type transistors, all of the N-type transistors are set to be the P-type transistors, and the high levels and the low levels of the related signals are interchanged, for example, the effective levels of the first scanning signal and the second scanning signal are both set to be low levels, and the ineffective levels of the first scanning signal and the second scanning signal are both set to be high levels. It is easy to understand that such changes will cause the high level in a circuit working principle to be changed into the low level and the low level in the circuit working principle to be changed into the high level. The direction of the potential at each node is changed into the opposite direction, but the essence of the circuit working circuit keeps unchanged. Therefore, the changed circuit structure, circuit timing, and circuit working principle can be understood in comparison with the above embodiments, which are not repeated herein.

Based on the same inventive concept, there is further provided in an embodiment of the present disclosure an array substrate, which may comprise any of above pixel circuits, and may be any of above array substrates. The array substrate can achieve the same or corresponding beneficial effects based on the beneficial effects that can be achieved by the included pixel circuit. In a possible implementation manner, a plurality of the pixel circuits are arranged in a plurality of rows and columns. The array substrate further comprises a plurality of rows of scanning lines respectively connected to each row of pixel circuits. Herein, the scanning sub-circuit in any pixel circuit is connected to a scanning line in a row where the pixel circuit is located, so as to connect the first scanning signal via the scanning line. The carrier releasing sub-circuit in a row other than the first row in any of the pixel circuits is connected to the scanning line of a row previous to the row where the pixel circuit is located, so as to connect the second scanning signal via the scanning line.

Figure 8:
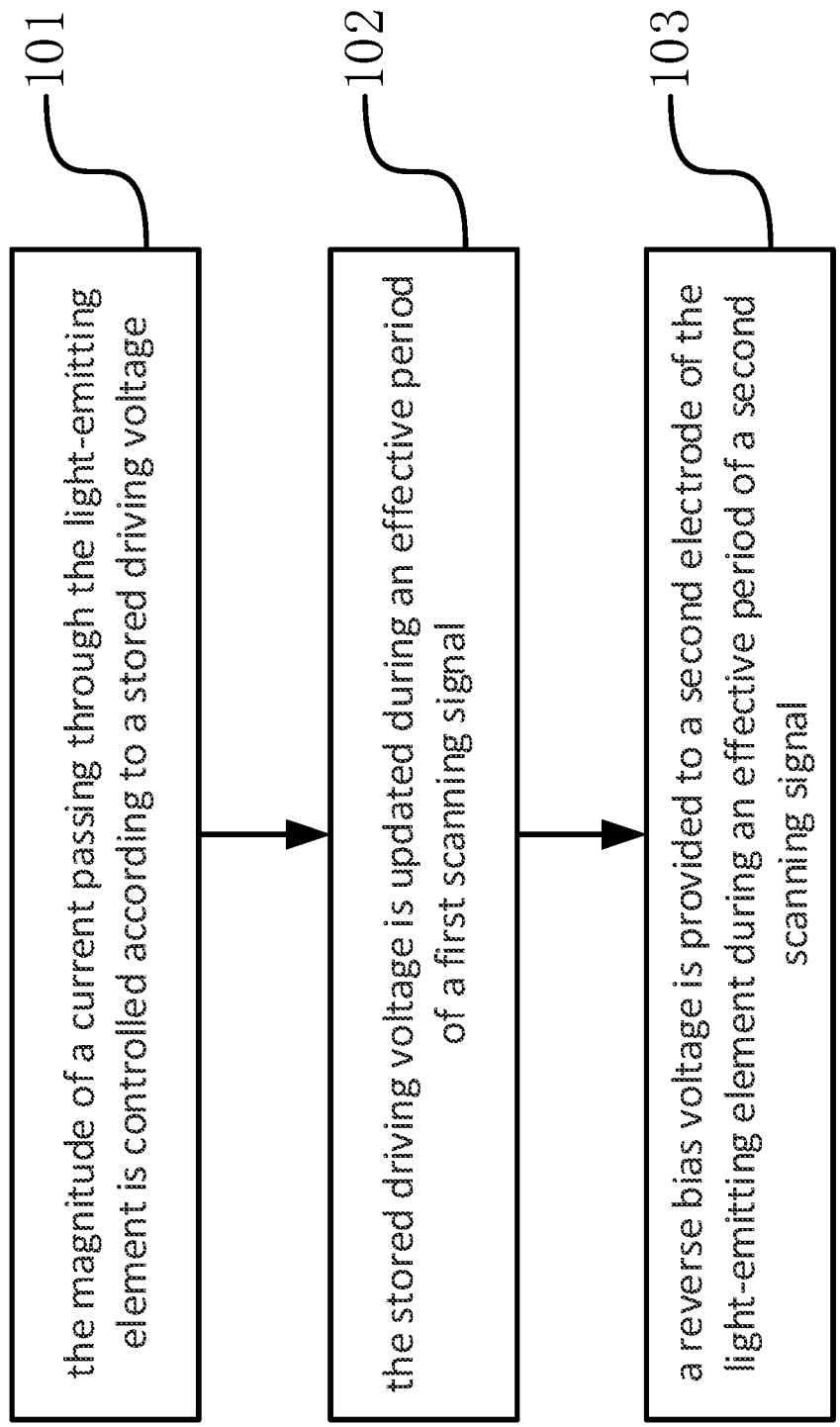
FIG. 8 is a flowchart of a driving method of a pixel circuit according to an embodiment of the present disclosure.

Based on the same inventive concept, there is further provided in an embodiment of the present disclosure a display device, comprising any one of the pixel circuits or any one of the array substrates mentioned above. The display device in the embodiments of the present disclosure may be a mobile phone, a tablet computer, a TV, a display, a laptop computer, a digital photo frame, a navigator or any product or part with a display function thereof. The display device may obtain the same or corresponding beneficial effects based on the beneficial effects that may be obtained by the pixel circuits or the array substrates, FIG. 8 is a flowchart of a driving method of a pixel circuit according to an embodiment of the present disclosure. The pixel circuit includes a light-emitting element. Referring to FIG. 8, the driving method may include the following working processes.

In step 101, the magnitude of a current passing through the light-emitting element is controlled according to a stored driving voltage.

In step 102, the stored driving voltage is updated during an effective period of a first scanning signal.

In step 103, a reverse bias voltage is provided to a second electrode of the light-emitting element during an effective period of a second scanning signal.

Herein, the first electrode and the second electrode of the light-emitting element are respectively one of a positive electrode and a negative electrode, and the effective period of the second scanning signal is prior to the effective period of the first scanning signal in each display period.

It should be understood that the working process of any of above pixel circuits can be regarded as an example of the implementation manner for the above driving methods. Therefore, the specific process examples of the foregoing steps may refer to the above descriptions, which are not repeated herein. It should also be understood that the reference signs of the above steps do not imply the execution order of the steps. For example, the above steps 101 and 102 may be in a random order, and the above steps 101 and 103 may be in a random order, which may not be limited thereto.

It can be seen that the light-emitting element can be periodically set to a reverse bias state in the embodiments of the present disclosure, so that the carriers accumulated on the two electrodes of the light-emitting element can be periodically released, thereby preventing the built-in electric field inside the light-emitting element from gradually increasing and hindering the light emission. Therefore, in the embodiments of the present disclosure, the decrease of the light-emitting efficiency of the light-emitting element along with the service time can be delayed, which is favorable to prolong the light-emitting life of the light-emitting element, suppress the deterioration of the picture quality of the OLED display device along with the service time, and prolong the service life of the OLED display device.

The foregoing descriptions are merely exemplary embodiments of the present disclosure, and are not intended to limit the present disclosure. Within the spirit and principles of the disclosure, any modifications, equivalent substitutions, improvements, etc., shall fall into the protection scope of the appended claims of the present disclosure.

What is claimed is:

1. A pixel circuit, comprising a light-emitting element, a driving sub-circuit, a scanning sub-circuit, and a carrier releasing sub-circuit;
wherein the driving sub-circuit is connected to a first electrode of the light-emitting element, and the driving sub-circuit is configured to store a driving voltage and control a magnitude of a current passing through the light-emitting element according to the driving voltage;
the scanning sub-circuit is connected to the driving sub-circuit, and the scanning sub-circuit is configured to update the driving voltage stored by the driving sub-circuit during an effective period of a first scanning signal; and the carrier releasing sub-circuit is connected to a second electrode of the light-emitting element, and the carrier releasing sub-circuit is configured to provide a reverse bias voltage to the second electrode of the light-emitting element during an effective period of a second scanning signal, the first electrode and the second electrode of the light-emitting element are one of a positive electrode and a negative electrode respectively, and the effective period of the second scanning signal is prior to the effective period of the first scanning signal in each display period;

wherein the carrier releasing sub-circuit comprises a first switching sub-circuit connected to the second electrode of the light-emitting element, the first switching sub-circuit is configured to provide the reverse bias voltage to the second electrode of the light-emitting element during the effective period of the second scanning signal, and the first switching sub-circuit comprises a first capacitor and a first transistor;

wherein a first end of the first capacitor is connected to the second electrode of the light-emitting element, and a second end of the first capacitor is connected to the supply voltage of the second electrode of the light-emitting element;

a gate electrode of the first transistor is connected to the second scanning signal, and one of a source electrode and a drain electrode of the first transistor is connected to the reverse bias voltage, and the other one is connected to the second electrode of the light-emitting element; and a voltage of the second scanning signal during the effective period is within a range of a gate electrode voltage enabling the first transistor to be turned on.

2. The pixel circuit according to claim 1, wherein the carrier releasing sub-circuit further comprises:

a second switching sub-circuit connected to the second electrode of the light-emitting element and configured to provide a supply voltage of the second electrode of the light-emitting element to the second electrode of the light-emitting element during a period other than the effective period of the second scanning signal.

3. The pixel circuit according to claim 2, wherein the second switching sub-circuit comprises a second transistor, a gate electrode of the second transistor is connected to the second scanning signal, and one of a source electrode and a drain electrode of the second transistor is connected to the second electrode of the light-emitting element and the other one is connected to the supply voltage of the second electrode of the light-emitting element; and a voltage of the second scanning signal during the effective period is within a range of the gate electrode voltage enabling the second transistor to be turned off.

4. The pixel circuit according to claim 3, wherein the driving sub-circuit comprises a second capacitor and a third transistor;

a first end of the second capacitor is connected to the supply voltage of the first electrode of the light-emitting element, and a second end of the second capacitor is connected to a gate electrode of the third transistor; and the gate electrode of the third transistor is connected to the scanning sub-circuit, and one of a source electrode and a drain electrode of the third transistor is connected to a supply voltage of a first electrode of the light-emitting element, and the other one is connected to the first electrode of the light-emitting diode.

5. The pixel circuit according to claim 3, wherein the scanning sub-circuit comprises a fourth transistor, a gate electrode of the fourth transistor is connected to the first scanning signal, and one of a source electrode and a drain electrode of the fourth transistor is connected to a data voltage, and the other one is connected to the driving sub-circuit.

6. The pixel circuit according to claim 2, wherein the driving sub-circuit comprises a second capacitor and a third transistor;

a first end of the second capacitor is connected to the supply voltage of the first electrode of the light-emitting element, and a second end of the second capacitor is connected to a gate electrode of the third transistor; and the gate electrode of the third transistor is connected to the scanning sub-circuit, and one of a source electrode and a drain electrode of the third transistor is connected to a supply voltage of a first electrode of the light-emitting element, and the other one is connected to the first electrode of the light-emitting diode.

7. The pixel circuit according to claim 1, wherein the driving sub-circuit comprises a second capacitor and a third transistor;

a first end of the second capacitor is connected to the supply voltage of the first electrode of the light-emitting element, and a second end of the second capacitor is connected to a gate electrode of the third transistor; and the gate electrode of the third transistor is connected to the scanning sub-circuit, and one of a source electrode and a drain electrode of the third transistor is connected to a supply voltage of a first electrode of the light-emitting element, and the other one is connected to the first electrode of the light-emitting diode.

8. The pixel circuit according to claim 2, wherein the scanning sub-circuit comprises a fourth transistor, a gate electrode of the fourth transistor is connected to the first scanning signal, and one of a source electrode and a drain electrode of the fourth transistor is connected to a data voltage, and the other one is connected to the driving sub-circuit.

9. The pixel circuit according to claim 1, wherein the scanning sub-circuit comprises a fourth transistor, a gate electrode of the fourth transistor is connected to the first scanning signal, and one of a source electrode and a drain electrode of the fourth transistor is connected to a data voltage, and the other is connected to the driving sub-circuit.

10. The pixel circuit according to claim 2, wherein the light-emitting element comprises a hole injection layer, a hole transport layer, an organic light-emitting layer, an electron transport layer and an electron injection layer that are sequentially stacked between the first electrode and the second electrode.

11. The pixel circuit according to claim 1, wherein the light-emitting element comprises a hole injection layer, a hole transport layer, an organic light-emitting layer, an electron transport layer and an electron injection layer that are sequentially stacked between the first electrode and the second electrode.

12. An array substrate comprising a plurality of the pixel circuits according to claim 1.

13. The array substrate according to claim 12, wherein the plurality of the pixel circuits are in a plurality of rows and columns, and the array substrate further comprises a plurality of rows of scanning lines respectively connected to each row of pixel circuits;
- wherein a scanning sub-circuit in any of the pixel circuits is connected to a scanning line of a row where the pixel circuit exists, to connect the first scanning signal via the scanning line; and
- a carrier releasing sub-circuit in any of the pixel circuits other than a first row is connected to a scanning line of a row previous to the row where the pixel circuit exist, to connect the second scanning signal by the scanning line.

14. A display device, comprising the array substrate according to claim 12.

15. A display device, comprising the pixel circuit according to claim 1.

* * * * *